United States Patent [19]

Davis

[11] 4,305,064

[45] Dec. 8, 1981

[54] HIGH DENSITY ANALOG-TO-DIGITAL CONVERTER

[75] Inventor: William F. Davis, Tempe, Ariz.

[73] Assignee: Motorola Inc., Schaumburg, Ill.

[21] Appl. No.: 91,432

[22] Filed: Nov. 5, 1979

Related U.S. Application Data

[63] Continuation of Ser. No. 836,632, Sep. 26, 1977, abandoned.

[51] Int. Cl.³ .............................................. H03K 13/02
[52] U.S. Cl. ......................... 340/347 AD; 340/347 M; 357/92
[58] Field of Search .................. 340/347 M, 347 AD; 357/92; 354/23 D, 60 L, 60 R

[56] References Cited

U.S. PATENT DOCUMENTS

| | | | |
|---|---|---|---|
| 3,142,056 | 7/1964 | Martin et al. | 340/347 AD |
| 3,537,101 | 10/1970 | Campanella et al. | 340/347 AD |
| 3,594,766 | 7/1971 | Gilbert | 340/347 AD |
| 3,940,760 | 2/1976 | Brokaw | 340/347 M X |
| 4,112,439 | 9/1978 | Kawasaki et al. | 354/60 L X |
| 4,158,782 | 6/1979 | Price | 357/92 X |

OTHER PUBLICATIONS

Pressman, Design of Transistorized Circuits for Digital Computers, J. F. Rider, Inc., 1959, pp. 3-51 to 3-54.
Hart et al., Bipolar LSI Takes a New Direction with Integrated Injection Logic, Electronics, Oct. 3, 1974, pp. 111-118.

Primary Examiner—Thomas J. Sloyan
Attorney, Agent, or Firm—Maurice J. Jones, Jr.

[57] ABSTRACT

Combining integrated injection logic (I²L) and linear circuitry permits fabrication of a highly dense analog-to-digital (A-to-D) converter. The heart of the A-to-D converter is a linear-I²L plurality of high density variable current sources which are proportional to each other. These variable current sources, when used in combination with I²L constant current sources and current sensing means, provide a highly compact A-to-D converter.

13 Claims, 2 Drawing Figures

HIGH DENSITY ANALOG-TO-DIGITAL CONVERTER

This is a continuation of application Ser. No. 836,632, filed Sept. 26, 1977 now abandoned.

BACKGROUND OF THE INVENTION

This invention relates, in general, to analog-to-digital converters, and more particularly, to monolithic integrated analog-to-digital converters having I²L-linear circuitry and method of making same.

Analog-to-digital (A-to-D) converters are widely used in the electronics industry for quantizing analog voltages to discrete levels thereby permitting further processing utilizing digital circuitry. In the past, this A-to-D conversion has often presented troublesome design problems, and many schemes for performing this conversion have been set forth in the electronics literature. Furthermore, these A-to-D converters, when compared with other portions of most digital processing circuitry, are generally complicated, involving several device types. As a result, an integrated A-to-D converter tends to use a large amount of semiconductor substrate area in comparison to the rest of the digital processing circuitry.

Therefore, it can be appreciated that an A-to-D converter which is simple in concept, requiring only a few devices, and requiring a relatively small area on a semiconductor chip is highly desirable.

SUMMARY OF THE INVENTION

Accordingly, it is an object of this invention to provide a method for constructing an improved integrable analog-to-digital converter which is relatively simple in concept.

It is also an object of this invention to provide highly compact variable current sources.

It is another object of this invention to provide an integrable A-to-D converter which consists of relatively few electronic devices.

Yet another object of this invention is to provide an integrable A-to-D converter which utilizes high density integrated injection logic (I²L) current sources in combination with linear circuitry.

It is also an object of this invention to provide an integrable A-to-D converter which requires a minimal amount of semiconductor chip area.

An illustrated embodiment of the invention provides a highly compact analog-to-digital converter having an analog input terminal and a plurality of binary output terminals comprising, first, a plurality of fixed current sources. In addition, a like number of variable current sources, each one coupled to one of the fixed current sources to form a fixed-variable current source pair with each of the variable current sources capable of passing current at a fixed ratio to each other. Also provided is a means for varying the current passing through each of the variable current sources in response to an analog input voltage at the analog input terminal, means for sensing the relative currents from the fixed current source and the variable current source in each of the fixed-variable current pairs, and means for indicating at the output terminals in a binary format whether the current capacity of the fixed current source is greater or less than the capacity of the variable current source in each of the fixed-variable current source pairs.

Also provided is a method for producing a highly compact analog-to-digital converter having an analog input terminal and a plurality of binary output terminals which comprises the steps of, first, providing a substrate into which is deposited a plurality of I²L gates, each gate having a fixed injection current, an input node, and at least one output node wherein the output nodes form the binary output terminals. Also deposited into the substrate is a plurality of high density variable current sources, each having a fixed current ratio with respect to each other, and each having an output node which is coupled to the input node of the I²L gates to selectively enable each of the I²L gates as determined by the current of each of the current sources. A region is deposited in the substrate comprising linear circuitry for receiving an analog input signal at the analog input terminal and for varying the current capacity of the high density variable current sources in response to the analog input signal to cause an analog-to-digital conversion of the input signal.

DESCRIPTION OF THE PREFERRED EMBODIMENT

Figure 1:
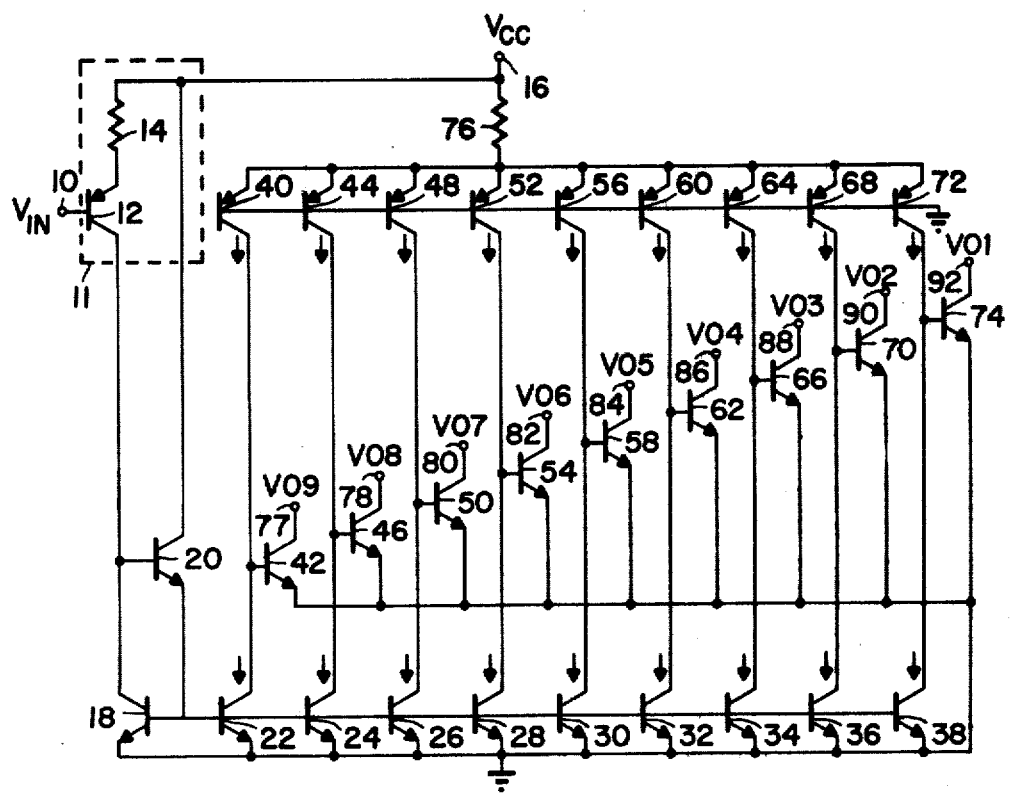
FIG. 1 is a circuit diagram of an embodiment of an A-to-D converter.

Now referring to FIG. 1, input terminal 10 for receiving an analog voltage is connected to the input of an analog voltage to analog current linear transformation circuit 11. For illustrative purposes, a crude linear transformation circuit 11 is shown as PNP transistor 12 and resistor 14. Input terminal 10 is connected to the base of PNP transistor 12, the emitter of which is connected to resistor 14 which, in turn, is connected to a positive DC supply voltage, $V_{CC}$, at terminal 16. The collector of transistor 12 is, in turn, connected to the collector of NPN transistor 18 and also to the base of NPN transistor 20. Transistor 18 has a common base with transistors 22, 24, 26, 28, 30, 32, 34, 36, and 38, and also has an emitter in common with these transistors which is connected to ground or a reference potential. The collector of transistor 20 is connected to $V_{CC}$ and the emitter is connected to the base of transistor 18. The collector of transistor 22 is connected to the collector of PNP fixed current source transistor 40 and also to the base of NPN output transistor 42. In a similar manner, the collector of transistor 24 is connected to the collector of PNP fixed current source transistor 44 and to the base of output transistor 46; the collector of transistor 26 is connected to the collector of PNP fixed current source transistor 48 and to the base of NPN output transistor 50; the collector of transistor 28 is connected to the collector of PNP fixed current source transistor 52 and the base of NPN output transistor 54; the collector of transistor 30 is connected to the collector of PNP fixed current source transistor 56 and to the base of NPN output transistor 58; the collector of transistor 32 is connected to the collector of PNP fixed current source transistor 60 and to the base of NPN output transistor 62; the collector of transistor 34 is connected to the collector of PNP fixed current source transistor 64 and to the base of NPN output transistor 66; the collector of transistor 36 is connected to the collector of PNP fixed current source transistor 68 and to the base of NPN output transistor 70; and the collector of transistor 38 is connected to the collector of PNP fixed current source transistor 72 and to the base of NPN output transistor 74. PNP fixed current source transistors 40, 44, 48, 52, 56, 60, 64, 68, and 72 have a common base which is connected to ground and a common emitter which is connected to one side of resistor 76 the other side of which is connected to the positive DC supply voltage, $V_{CC}$, at terminal 16. Each of NPN output transistors 42, 46, 50, 54, 58, 62, 66, 70, and 74 have a common emitter connection which is connected to ground, and the collectors of each of the respective transistors form the nine digital output terminals of the A-to-D converter.

In operation, an analog voltage at input terminal 10 controls, via the linear voltage to current transformation circuit 11 which, in turn, determines the current through transistor 18, the magnitude of which is reflected into each of the variable current source transistors 22, 24, 26, 28, 30, 32, 34, 36, and 38. That is, the current in the collector of transistor 18 is mirrored in a proportional amount by each of the variable current source transistors. Transistor 20 acts as a buffer and current amplifier to provide sufficient base drive for each of the variable current source transistors and minimize loading on the collector current of transistor 18. Also, each of the variable current source transistors have a proportionate amount of current sinking capability such that if transistor 38 is sinking one unit of current, transistor 36 will have a two unit capability, transistor 34 will have a three unit capability, transistor 32 will have a four unit capability, transistor 30 will have a five unit capability, transistor 28 will have a six unit capability, transistor 26 will have a seven unit capability, transistor 24 will have an eight unit capability, and transistor 22 will have a nine unit capability. Supplying current to these variable current sources is a series of fixed current sources comprised of transistors 40, 44, 48, 52, 56, 60, 64, 68, and 72. These transistors, together with resistor 76, which determines the amount of injector current for the fixed current sources, provide a fixed current for each of the variable current sources and for output transistors 42, 46, 50, 54, 58, 62, 66, 70, and 74. Each of the fixed current sources is paired with one of the variable current source transistors to form a fixed and variable current source pair. When the current supplied by the fixed current source is greater than the current being absorbed by the variable current source by an amount sufficient to provide enough base drive to force the output transistor into saturation, then the output transistor will pull an output voltage low. However, as the variable current source capability increases to become greater than that current supplied by the fixed current source, then the output transistor will be robbed of its base drive and will be unable to sink an output load (not shown). When the analog input voltage at terminal 10 is at a high level, the output current of circuit 11 will be zero, demonstrated by the current cut off of transistor 12. Since the collector current of transistor 18 is reduced to zero, none of the variable current sources transistors will be conducting, and each of the fixed current sources will be supplying current to the base of the nine output transistors. Thus, each of output terminals 77, 78, 80, 82, 84, 86, 88, 90, and 92 will be at the low voltage state. As the analog voltage at terminal 10 decreases to, in turn increase the output current of circuit 11 by bringing transistor 12 into conduction and supply more current to the collector of transistor 18, then the variable current sources will start to conduct and at some point each of the variable current sources will be able to sink more current than that which can be supplied by the fixed current source, and the respective output transistor will be cut off thereby allowing the output terminal to go high. Since the current capability of variable current source transistor 22 is the greatest for a given collector current in transistor 18, output transistor 42 will be the first to turn off and output terminal 77 will go high before the rest of the output terminals change state. In a like manner, each of output terminals 78, 80, 82, 84, 86, 88, 90, and 92 will go to the high digital state in a domino sequence as the analog voltage at input terminal 10 varies over the range of the A-to-D converter. Thus, the A-to-D converter has a ten state capability in that a high input voltage at terminal 10 will cause all the output transistors to be conducting, and as the input voltage decreases output transistors 42, 46, 50, 54, 58, 62, 66, 70, and 74 will become nonconducting in sequence until the lower limit of the A-to-D converter is reached wherein all the output transistors will be nonconducting.

Thus, it is seen that the A-to-D conversion is accomplished with relatively few devices in a straightforward, uncomplicated manner.

Figure 2:
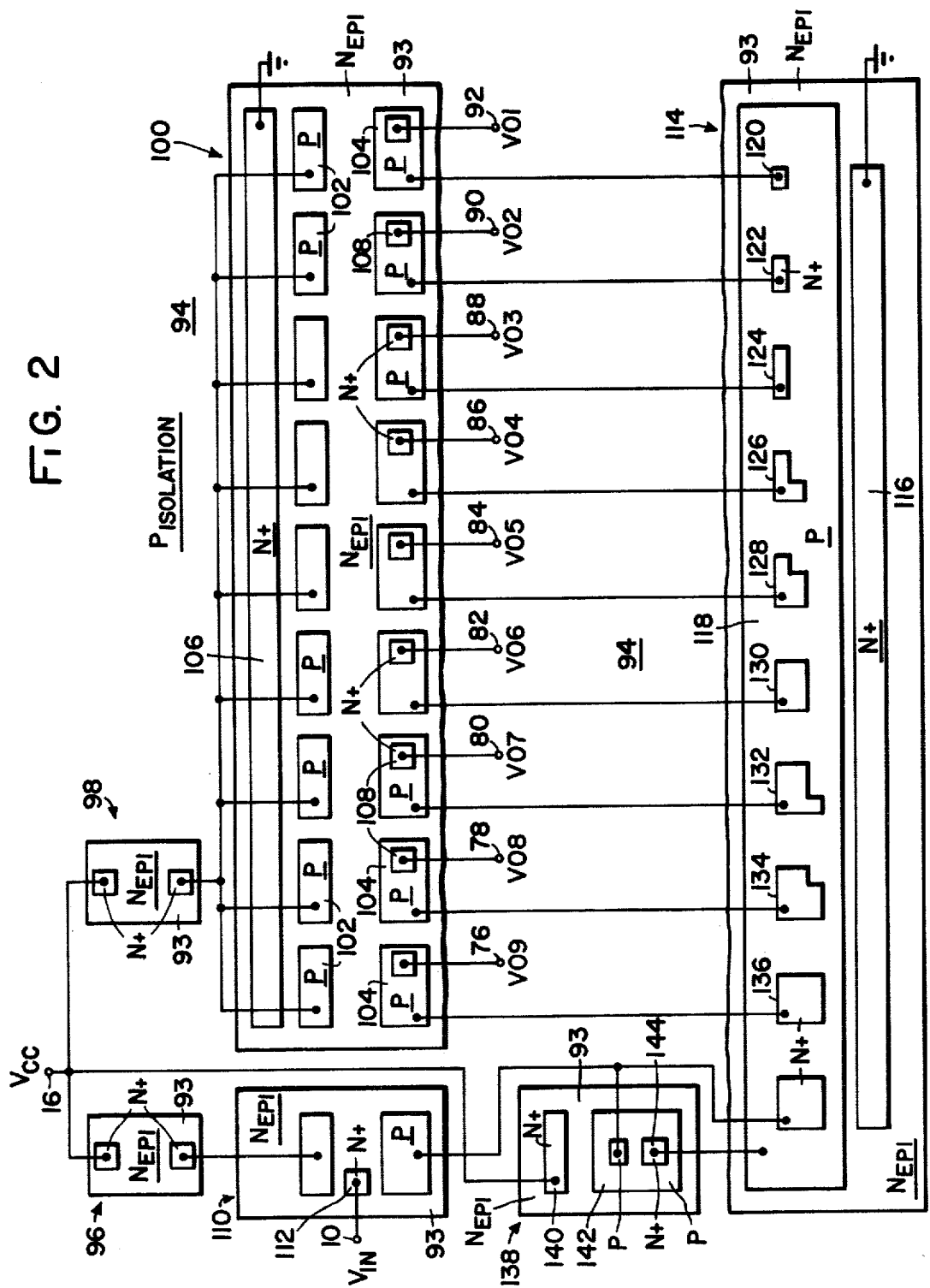
FIG. 2 is a representation of a circuit layout on a monolithic semiconductor substrate to produce the circuit shown in FIG. 1.

FIG. 2 is a diagram of the layout on a monolithic semiconductor substrate of the circuit of FIG. 1. The diagram indicates the combination of integrated injection logic (I²L) together with conventional linear circuitry. On a monolithic P-type substrate an N-type epitaxial layer 93 is grown and P-type isolation regions 94 are diffused into the epitaxial layer to isolate each of the circuit types. Two areas of isolated N-region shown as regions 96 and 98 form resistors 14 and 76 of FIG. 1, respectively. The fixed current source transistors are formed in area 100 using conventional I²L techniques. That is, the current source transistors are lateral PNPs and the output transistors are vertical NPNs incorporated into the same area with their collectors up (i.e., the collector region is the normal emitter region of conventional vertical transistors) and operate in the inverted beta mode. Thus, the emitters of the fixed current source transistors are P diffusions 102 in region 100 and the collectors of the fixed current source transistors are a second set of P diffusion regions 104. Elongated N+ diffusion 106 is diffused into epi region 93 to form a contact with the base region of the fixed current source transistors. This base region also serves as the emitters for the output transistors. P regions 104 which form the collectors for the fixed current source transistors also function as the bases for the output transistors, and N+ regions 108 are diffused into the P regions 104 to form the collectors for the output transistors. N region 98, as a resistor, determines the amount of fixed injector current into all of the fixed current sources of region 100. This construction is conventional in the art and well known to anyone skilled in I²L fabrication. Similarly, input transistor 12 of FIG. 1 is a lateral PNP transistor of conventional linear circuitry and diffused in the same manner as the upper fixed current source transistors. This input transistor is formed in region 110 and fabricated in the same manner and at the same time as region 100 so that the input transistor and the fixed current source transistors have matching operating characteristics.

Input terminal 10 of FIG. 1 is connected to N+ diffusion region 112 and thereby to the base of transistor 12 formed in area 110. The variable current source transistors are formed in region 114, again using I²L fabrication techniques. That is, the collector of the transistors are up in the normal emitter position of conventional transistors and the device thus has inverse beta characteristics. However, this I²L construction permits the ratioing of a collector area for each of the variable current source transistors. Thus, the transistors share a common emitter, shown as elongated N+ diffusion region 116, and also a common base region of P-type material of region 118. However each of the transistors have a separate collector region which have collector-to-base contact areas in proportion to each other. Thus, the collector of transistor 38, in FIG. 1, is represented by N+ region 120 of FIG. 2. In a like manner, the collectors of transistors 36, 34, 32, 30, 28, 26, 24, and 22 of FIG. 1 are shown as N+ areas 122, 124, 126, 128, 130, 132, 134, and 136 of FIG. 2, respectively. As can be seen from the collector areas of FIG. 2, the collector-to-base contact area and, thus, the relative current carrying capability for each of the variable current source transistors is proportional to each other with area 120 being equal to one-half of area 122 of transistor 36. In a like manner, area 120 is one-third, one-fourth, one-fifth, one-sixth, one-seventh, one-eighth, and one-ninth of each of other areas 124, 126, 128, 130, 132, 134, and 136, respectively. Finally, region 138 represents transistor 20 of FIG. 1 and is a conventional NPN vertical transistor and thus provides conventional beta characteristics to supply current as base drive for each of the variable current source transistors. The collector contact of transistor 20 of FIG. 1 is comprised of N+ region 140 and the base is comprised of P diffusion 142, and the emitter of N+ diffusion 144. It is also possible to diffuse on the same substrate a linear isolation amplifier to drive input terminal 10 and to further realize the advantage of combining I²L and linear devices on a common substrate.

Since resistors 14 and 76 of FIG. 1 and 96 and 98 of FIG. 2 are formed in the same manner, they will initially have substantially the same operating characteristics and will substantially track each other over temperature. Also, PNP input transistor 12 of FIG. 1 is formed in the same manner as PNP fixed current source transistors 40, 44, 48, 52, 56, 60, 64, 68, and 72, they will have essentially identical characteristics, both initially and over temperature. Thus, the current through the variable current sources and the fixed current sources will be essentially at a fixed ratio to each other, independent of process variations and environmental changes.

Although in the preferred embodiment the fixed current sources each have the same current sourcing capability, it will be understood by those skilled in the art that it would be possible to also ratio the collector-to-base contact area of the fixed current source transistors to vary the current from each of these sources.

It will also be understood by those skilled in the art that the analog voltage to analog current linear transformation circuit 11 may be any of the various types of such circuits, and that the linear transformation circuit 11, shown as PNP transistor 12 and resistor 14 in the preferred embodiment, is by way of example only.

This circuit construction, using I²L techniques in combination with linear circuitry, results in a considerable savings of chip area on a semiconductor substrate. The variable current sources region of area 114 results in a significant savings as compared to the same variable current sources implemented using conventional transistors which ratio the emitter-to-base contact area. Also, the combination of the fixed current source transistors and the output transistors into single region 100 results in more savings of semiconductor substrate area. In addition since the N regions for both the variable and fixed current sources are grounded, they could be constructed in one common N region.

While the invention has been particularly shown and described with reference to preferred embodiments thereof, it will be understood by those skilled in the art that various changes may be made therein without departing from the teachings of the invention. Therefore, it is intended in the appended claims to cover all such equivalent variations as come within the spirit and scope of the invention.

What is claimed is:

1. A compact analog-to-digital converter suitable for being provided in monolithic integrated circuit form, having an analog input terminal and a plurality of binary output terminals, comprising:
   (a) a semiconductor substrate;
   (b) a first region disposed in said substrate, said first region comprising a plurality of I²L gates each having a fixed injection current of a constant magnitude, an input node coupled to receive said injection current and at least one output node, said output nodes being coupled to separate binary output terminals;
   (c) a plurality of constant current sources for providing said injection currents being coupled to said I²L gates;
   (d) a second region disposed in said substrate and comprising a plurality of variable high density current circuits, each of said current circuits having different maximum current conducting capacities, and each current circuit having an output node coupled to said input node of each of said I²L gates in said first region to facilitate selective enablement of each of said I²L gates as determined by the maximum current of each of said current circuits relative to said injection current; and
   (e) means for varying the maximum current conducting capacities of said variable high density current circuits in response to the magnitude of an analog input signal at the analog input terminal to cause an analog-to-digital conversion of said input signal, said means for varying the maximum current conducting capacities including a voltage-to-current converter circuit, said voltage-to-current converter controlling said variable high density current circuits for varying the magnitudes of the maximum currents which can be passed by said variable high density current circuits.

2. The analog-to-digital converter of claim 1 wherein said constant current sources include:
   bipolar transistors each having an emitter electrode, a base electrode and a collector electrode;
   conductive circuit means electrically connecting all of said emitter electrodes together;
   resistive means connected to said commonly connected emitter electrodes;
   further conductive circuit means electrically connecting all of said base electrodes together; and
   said collector electrodes each providing an injection current, all of said injection currents having the same predetermined constant magnitude.

3. The analog-to-digital converter of claim 1 wherein said plurality of variable high density current circuits include:

bipolar transistors each having an emitter of the same area, a base and a collector with electrodes connected thereto, said collectors having different areas with all collector areas except the smallest collector area being integral multiples of the smallest collector area;

conductive circuit means electrically interconnecting all of said emitter electrodes of said bipolar transistors of said variable high density current circuits;

further conductive circuit means electrically interconnecting all of said base electrodes of said bipolar transistors; and each of said collector electrodes of said bipolar transistors of said variable high density current circuits being connected to an input terminal of one of said I$^2$L gates.

4. The analog-to-digital converter of claim 1 wherein said I$^2$L gates include:

a further set of bipolar transistors each having an emitter electrode, a base electrode and a collector electrode;

additional conductive circuit means electrically interconnecting said emitter electrodes of said further set of bipolar transistors;

another conductive circuit means electrically connecting each of said base electrodes of said further set of bipolar transistors to the high density variable current circuits; and other circuit means connecting said collector electrodes of said further set of bipolar transistors to the binary output terminals of the analog-to-digital converter circuit.

5. The analog-to-digital converter of claim 3 wherein:

said voltage-to-current converter circuit is connected to said commonly connected base electrodes of the bipolar transistors of said variable high density current circuits, said voltage-to-current converter controlling the conductivity of each of said bipolar transistors of said variable high density current circuits for varying the magnitudes of the maximum currents which can be passed by said variable high density current circuits.

6. An analog-to-digial converter having an analog input terminal adapted to receive an analog input signal and a plurality of output terminals at which a binary signal indicative of the magnitude of the analog signal is provided, comprising:

(a) a plurality of fixed current sources for providing currents having constant magnitudes;

(b) a plurality of variable current circuits each coupled to one of said fixed current sources to form a plurality of fixed and variable current pairs, said variable current circuits being adapted to pass currents having different maximum magnitudes;

(c) control means coupled to each of said variable current circuits for simultaneously varying the maximum magnitude of the current which can pass through each of said plurality of variable current circuits, said variation being in response to and related to the magnitude of the analog input signal, said control means including a voltage-to-current converter circuit; and (d) threshold means coupled to each of said plurality of fixed current sources and to each of said variable current circuits and to each of the plurality of output terminals, said threshold means being responsive to the relative magnitude of the constant current from said fixed current source and said maximum current of said variable current circuit of each of said fixed and variable current pairs to provide the binary signals at the output terminals indicative of the magnitude of the analog input signal, said binary signals being indicative of whether the magnitude of the constant current of said fixed current source is greater than or less than the maximum magnitude of the current passing capacity of said variable current circuit in each of said fixed and variable current pairs.

7. The analog-to-digital converter of claim 6 wherein each of said plurality of fixed current sources includes:

a bipolar transistor of a particular conductivity type, having an emitter electrode, a base electrode and a collector electrode;

first circuit means connecting all of said emitter electrodes together;

resistive means connected to said commonly connected emitter electrodes; and second circuit means connecting all of said base electrodes together; and said collector electrodes each providing a current having a constant magnitude.

8. The analog-to-digital converter of claim 7 wherein each of said plurality of variable current circuits includes:

a bipolar transistor having a second conductivity type different from the conductivity types of the bipolar transistors included in said fixed current sources, and each of said bipolar transistors of said second conductivity type having an emitter electrode, a base electrode and a collector electrode;

third circuit means interconnecting all of said emitter electrodes of said bipolar transistors of said second conductivity type;

fourth circuit means interconnecting all of said base electrodes of said bipolar transistors of said second conductivity type; and each of said collector electrodes of said bipolar transistors of said variable current circuits being connected to a corresponding collector electrode of one of said bipolar transistors of said fixed current sources.

9. The analog-to-digital converter of claim 8 wherein:

said voltage-to-current converter circuit is connected to the commonly connected base electrodes of the bipolar transistors of the second conductivity type, said voltage-to-current converter controlling the conductivity of each of the bipolar transistors of the second conductivity type for varying the magnitude of the maximum current which can be passed by the variable current circuits.

10. The analog-to-digital converter of claim 9 wherein:

said threshold means includes a further set of bipolar transistors of the second conductivity type each having an emitter electrode, a base electrode and a collector electrode;

further circuit means interconnecting said emitter electrodes of said further set of bipolar transistors;

additional circuit means connecting each of said base electrodes of said further set of bipolar transistors to the commonly connected collector electrodes of each of said fixed and variable current pairs; and other circuit means connecting said collector electrodes of said further set of bipolar transistors to said output terminals for the analog-to-digital converter circuit.

11. A compact analog-to-digital converter suitable for being provided in monolithic integrated circuit form, having an analog input terminal and a plurality of binary output terminals comprising:
  (a) a semiconductor substrate;
  (b) a first region disposed in said substrate, said first region comprising a plurality of I²L gates each having a fixed injection current of a constant magnitude, an input node coupled to receive the injection current and at least one output node, wherein said output nodes are coupled to separate binary output terminals;
  (c) a plurality of constant current sources coupled to said I²L gates for providing said injection currents;
  (d) a second region disposed in said substrate and comprising a plurality of variable high density current circuits, each of said current circuits having a different maximum current conducting capacity, and each current circuit having an output node coupled to said input node of each of said I²L gates in said first region to facilitate selective enablement of each of said I²L gates as determined by the maximum current of each of said current circuits relative to said injection current, said plurality of variable high density current circuits including bipolar transistors each having an emitter electrode, a base electrode and a collector electrode, conductive circuit means electrically interconnecting all of said emitter electrodes of said bipolar transistors of said variable high density current circuits, further conductive circuit means electrically interconnecting all of said base electrodes of said bipolar transistors, and each of said collector electrodes of said bipolar transistors of said variable high density current circuits being connected to an input terminal of one of said I²L gates; and
  (e) means for varying the maximum current conducting capacity of said variable high density current circuits in response to the magnitude of an analog input signal at the analog input terminal to cause an analog-to-digital conversion of said input signal, and said means for varying the maximum current including a voltage-to-current converter circuit connected to the commonly connected base electrodes of the bipolar transistors of the variable high density current circuits, said voltage-to-current converter controlling the conductivity of each of the bipolar transistors of the variable high density current circuits for varying the magnitudes of the maximum current which can be passed by each of the variable high density current circuits.

12. An analog-to-digital converter having an analog input terminal adapted to receive an analog input signal and a plurality of output terminals at which a binary signal indicative of the magnitude of the analog signal is provided comprising:
  (a) a plurality of fixed current sources for providing currents having constant magnitudes, each of said plurality of fixed current sources including a bipolar transistor of a particular conductivity type, having an emitter electrode, a base electrode and a collector electrode;
  (b) a plurality of variable current circuits each coupled to one of said fixed current sources to form a plurality of fixed and variable current pairs, said variable current circuits being adapted to pass currents having different maximum magnitudes, each of said plurality of variable current circuits including a bipolar transistor having a second conductivity type, and each of said bipolar transistors of said second conductivity type having an emitter electrode, a base electrode and a collector electrode, third circuit means interconnecting all of said emitter electrodes of said bipolar transistors of said second conductivity type, fourth circuit means interconnecting all of said base electrodes of said bipolar transistors of said second conductivity type, and each of said collector electrodes of said bipolar transistors of said variable current circuits being connected to a corresponding collector electrode of one of said bipolar transistors of said fixed current sources;
  (c) control means coupled to each of said variable current circuits for simultaneously varying the maximum magnitude of the current which can pass through each of said plurality of variable current circuits, said variation being in response to and related to the magnitude of the analog input signal, said control means including a voltage-to-current converter circuit connected to the commonly connected base electrodes of the bipolar transistors of the second conductivity type, said voltage-to-current converter controlling the conductivity of each of said bipolar transistors of the second conductivity type for varying the magnitude of the maximum current which can be passed by said variable current circuits; and
  (d) threshold means coupled to each of said plurality of fixed current sources and to each of said variable current circuits and to each of the plurality of output terminals, said threshold means being responsive to the relative magnitude of the constant current from said fixed current source and said maximum current of said variable current circuit of each of said fixed and variable current pairs to provide the binary signals at the output terminals indicative of the magnitude of the analog input signal, said binary signals being indicative of whether the magnitude of the constant current of said fixed current source is greater than or less than the maximum magnitude of the current passing capacity of said variable current circuit in each of said fixed and variable current pairs.

13. The analog-to-digital converter of claim 12 wherein:
  said threshold means includes a further set of bipolar transistors of said second conductivity type each having an emitter electrode, a base electrode and a collector electrode;
  further circuit means interconnecting said emitter electrodes of said further set of bipolar transistors;
  additional circuit means connecting each of said base electrodes of said further set of bipolar transistors to the commonly connected collector electrodes of each of said fixed and variable current pairs; and
  other circuit means connecting said collector electrodes of said further set of bipolar transistors to said output terminals of the analog-to-digital converter circuit.

* * * * *